(12) United States Patent
Fischer et al.

(10) Patent No.: US 9,606,859 B2
(45) Date of Patent: Mar. 28, 2017

(54) ADVANCED DIGITAL AUDIO BROADCASTING FORWARD ERROR CORRECTION PROCESSING IN PACKET MODE UTILIZING TOKENS

(71) Applicant: NXP B.V., Eindhoven (NO)

(72) Inventors: Joerg Fischer, Kesseldorf (DE); Dirk Johannes van Ginkel, Eindhoven (NL)

(73) Assignee: NXP B.V., Eindhoven (NL)

( * ) Notice: Subject to any disclaimer, the term of this patent is extended or adjusted under 35 U.S.C. 154(b) by 226 days.

(21) Appl. No.: 14/263,737

(22) Filed: Apr. 28, 2014

(65) Prior Publication Data

US 2015/0309860 A1 Oct. 29, 2015

(51) Int. Cl.
*H04L 1/00* (2006.01)
*G06F 11/10* (2006.01)
*H03M 13/27* (2006.01)
*H04H 60/11* (2008.01)
*H03M 13/15* (2006.01)

(52) U.S. Cl.
CPC ......... *G06F 11/10* (2013.01); *H03M 13/1515* (2013.01); *H03M 13/2707* (2013.01); *H04H 60/11* (2013.01); *H04L 1/0045* (2013.01); *H04L 1/0057* (2013.01)

(58) Field of Classification Search
None
See application file for complete search history.

(56) References Cited

U.S. PATENT DOCUMENTS

| 7,644,343 B2 * | 1/2010 | Gubbi | H03M 13/1515 370/392 |
| 8,335,969 B2 * | 12/2012 | Gubbi | H03M 13/1515 370/392 |
| 2006/0268726 A1 | 11/2006 | Alamaunu et al. | |
| 2007/0186143 A1 * | 8/2007 | Gubbi | H03M 13/1515 714/776 |

(Continued)

FOREIGN PATENT DOCUMENTS

WO 2006077521 A2 7/2006

OTHER PUBLICATIONS

Etsi; "Radio Broadcasting Systems; Digital Audio Broadcasting (DAB) to mobile, portable and fixed receivers"; ETSI EN 300 401, V1.4.1; p. 1-197; Jan. 2006.

(Continued)

*Primary Examiner* — Daniel McMahon

(57) ABSTRACT

In an embodiment, a method for performing forward error correction (FEC) on protected data packets is disclosed. The method involves creating a FEC table having columns for application data and columns for error-correction data (EC data). Then, a number of protected application data packets are received and placed in the FEC table. If an application data packet is received, then the application data from the packet is placed in the application data column. If an application data packet is not received, generated zeroes are placed in the application data column. Once the application data columns of the FEC table are full, EC data corresponding to the application data is received and placed in the EC data columns of the FEC table. The rows of the FEC table are then fed to the decoder for error correction.

16 Claims, 5 Drawing Sheets

(56) References Cited

U.S. PATENT DOCUMENTS

| | | | | |
|---|---|---|---|---|
| 2007/0240027 A1* | 10/2007 | Vesma | ................ | H03M 13/293 |
| | | | | 714/759 |
| 2007/0266294 A1* | 11/2007 | Vesma | .............. | H03M 13/1515 |
| | | | | 714/758 |
| 2009/0055715 A1* | 2/2009 | Jashek | .................. | H04L 1/0057 |
| | | | | 714/776 |
| 2009/0077454 A1* | 3/2009 | Wang | .................. | H03M 13/151 |
| | | | | 714/807 |
| 2009/0300468 A1* | 12/2009 | Pekonen | .......... | H03M 13/1515 |
| | | | | 714/776 |
| 2010/0115379 A1* | 5/2010 | Gubbi | .............. | H03M 13/1515 |
| | | | | 714/776 |

OTHER PUBLICATIONS

Extended European Search Report for application 15164788.0 (Sep. 18, 2015).

* cited by examiner

ADVANCED DIGITAL AUDIO BROADCASTING FORWARD ERROR CORRECTION PROCESSING IN PACKET MODE UTILIZING TOKENS

Digital Audio Broadcasting (DAB) is a standardized digital radio technology that offers an improvement in quality over traditional analog FM or AM broadcast signals. The improvement is due, in part, to a more robust handling of noise and transmission errors by a DAB system than by an analog system.

As defined in European Telecommunications Standards Institute ETSI 300401, DAB defines program services as well as data services multiplexed in an Ensemble. The program services or data services are made up of one or more service components organized in Fast Information Groups (FIGS.). A service component can be defined by a Service Component Type (SCTy) of either audio or data and can be transmitted either via a Fast Information Channel (FIC) or a Main Service Channel (MSC).

Typically, the MSC is used for a wide variety of applications and occupies the majority of a transmission frame. One mode of data service transmission is packet mode wherein service components utilize packets when sending data. To allow better protection against reception artifacts, the DAB standard implements Forward Error Correction (FEC) for MSC packets via Reed Solomon decoding to correct erroneous bytes. However, in order for Reed Solomon FEC to function properly, all MSC packets must be received in the correct order. Because packet drops or packet transformation may occur, it is not always possible to generate a properly filled FEC table for DAB MSC packets. Accordingly, a FEC technique that can tolerate dropped MSC packets or transformed MSC packets is needed.

In an embodiment, a method for performing forward error correction (FEC) on protected data packets is disclosed. The method involves creating a FEC table having columns for application data and columns for error-correction data (EC data). Then, a number of protected application data packets are received and placed in the FEC table. If an application data packet is received, then the application data from the packet is placed in the application data column. If an application data packet is not received, generated zeroes are placed in the application data column. Once the application data columns of the FEC table are full, EC data corresponding to the application data is received and placed in the EC data columns of the FEC table. The rows of the FEC table are then fed to the decoder for error correction.

In a second embodiment, a radio signal receiver is disclosed. The radio receiver is configured to prevent corruption of a forward error correction table (FEC table) due to a lost packet by inserting a token into a packet stream when loss of a packet is detected and placing filler data into a FEC table at a location which the application data of the lost packet would have occupied.

In a third embodiment, a method for preventing corruption of a forward error correction table (FEC table) due to a lost packet is disclosed. The method involves inserting a token into a packet stream when loss of a packet is detected and placing filler data into a FEC table at a location which the application data of the lost packet would have occupied.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
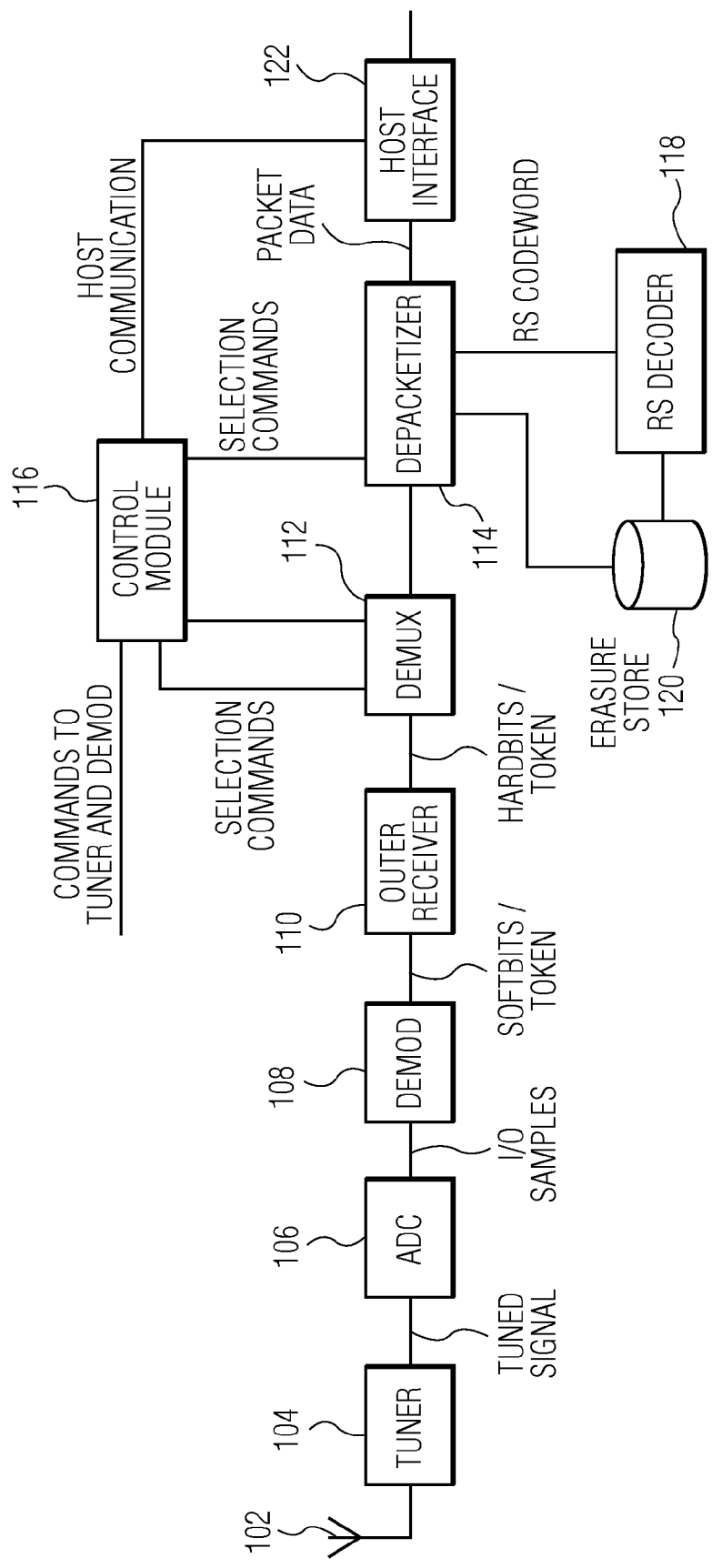
FIG. 1 is a block diagram of a DAB receiver configured to use a MSC packet data mode.

Turning now to FIG. 1, a block diagram of a DAB receiver configured to use a (MSC) packet data mode is depicted. The DAB receiver includes an antenna 102, a tuner 104, an analog to digital converter 106, a demodulator 108, an outer receiver 110, a demultiplexer 112, a depacketizer 114, a control module 116, a Reed-Solomon decoder 118, an erasure store 120, and a Host interface 122. The antenna receives an analog DAB signal, which the tuner tunes by filtering the analog DAB signal to a lower bandwidth and then sends the filtered signal along to the analog to digital converter (ADC). The ADC takes I/Q samples of the signal and converts the analog DAB signal to a digital DAB signal, which is then passed along to the demodulator. The demodulator attempts to synchronize with the DAB signal and performs Fast Fourier Transformation (FFT) and de-mapping of the orthogonal frequency division multiplex (OFDM) signal. As a result of FFT and de-mapping of the OFDM signal, the demodulator produces softbits, which are sent to the outer receiver for time-deinterleaving, depuncturing, viterbi decoding, and descrambling to produce hardbits. The hardbits are sent in a DAB specific frame format to the demultiplexer (demux), which breaks each DAB frame into smaller transport packets. The demux also adds metadata, such as the length, time, routing, and type information. Then, based on the route of each packet, the demux decides which part of the receiver system handles the packets. While packets could be sent to other parts of the receiver system such as to an audio source decoder, in an embodiment, the packets are sent to the depacketizer. The depacketizer keeps track of the synchronization state for each packet and fills data from the packet into a forward error correction (FEC) table. The completed FEC table is then de-interleaved by software into RS codewords that are provided to the RS decoder. The RS decoder performs correction operations on entries in the FEC table using the RS codewords and then interleaves the entries back into the FEC table. The useful data of the resultant FEC table is then sent to the host interface. The actions performed by each component of the DAB receiver are controlled by the Control module. In an embodiment, the Control module or layer is a complex software program that operates on received Fast Information Groups (FIGS.), routes internal data, serves external interfaces, and implements a command interface on a host device. In an embodiment, the Control module sends commands to each of the components.

Figure 2:
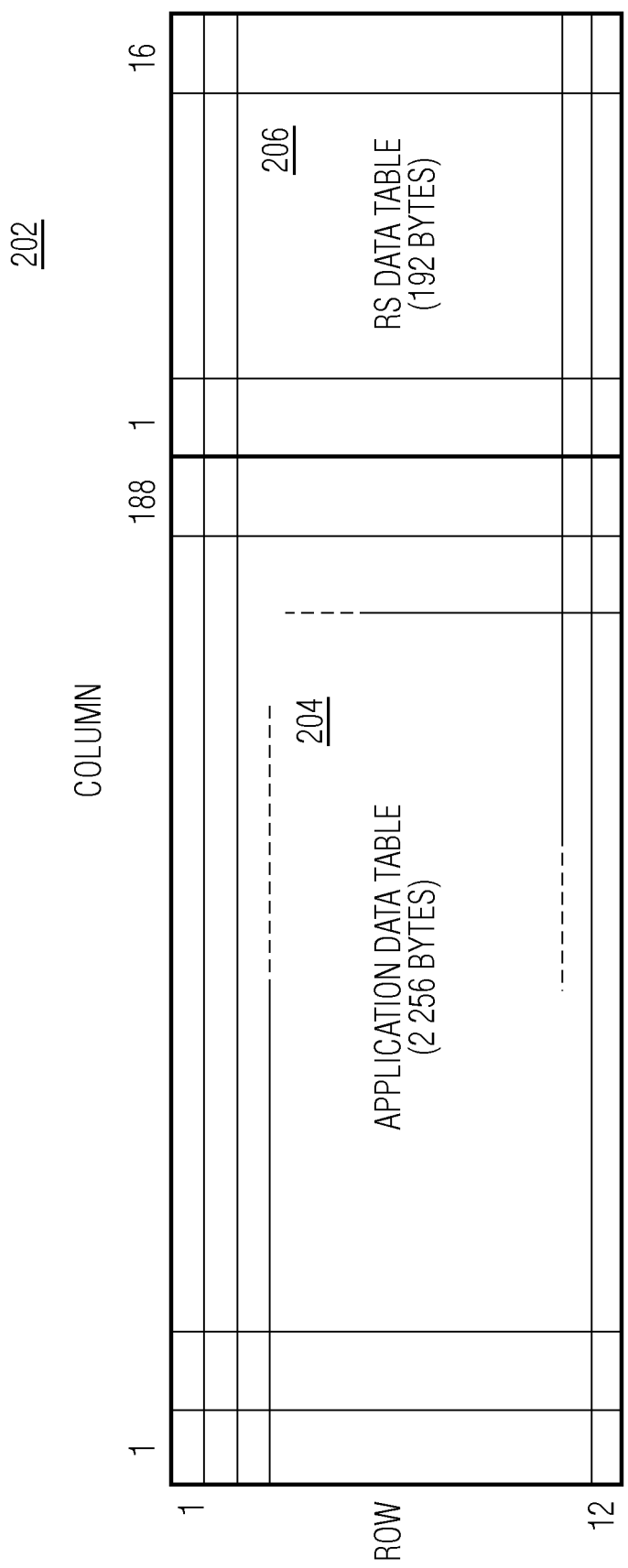
FIG. 2 is an embodiment of an FEC table.

FIG. 2 depicts an embodiment of the FEC table 202 discussed above with respect to FIG. 1 as described by the DAB standard. In accordance with the DAB standard, the table has fixed dimensions of 12 rows and 204 columns and is divided so that the first 188 columns are used to store an Application Data Table 204 and the remaining columns (189-204) are used to store a RS Data Table 206. The rows and columns are filled with application data and RS data from the application data packets or token packets received by the depacketizer 114. Application data is initially filled into the Application Data Table of the FEC table starting at the top left corner of the Application Data Table (cell 1/1) and then into consecutive cells (e.g., cells 1/2, 1/3, 1/4) until application data fills the last cell of the Application Data Table (cell 12/188). After the application data has filled in the Application Data Table of the FEC table, RS data is filled into the RS Data Table of the FEC table beginning at cell 1/1 and then into consecutive cells until RS data fills cell 12/16.

As discussed with respect to FIG. 1, each row of the FEC table is then de-interleaved into RS codewords and fed into an RS decoder. As is shown in FIG. 2, each row of the FEC table has cells from the Application Data Table 204 and cells from the RS Data Table 206. Typically, in order for the RS decoder to successfully use a corresponding RS codeword to perform error correction, the RS data in each row must correspond to the application data in the same row. Under normal circumstances, where signal strength is optimal, each row of the FEC table will be filled and the DAB receiver will operate properly to deliver useful and error-corrected data to the host interface. However, if a DAB signal experiences interference or if signal strength is weak, parts of the signal can be lost which could result in application data packets not being received by the depacketizer. If application data packets are not received by the depacketizer, then subsequent packets can be placed in wrong cells and the error correction process may use an incorrect RS codeword to correct the application data in a row. Thus, the table can become corrupt and RS error correction may not be possible because, in most cases, all of the bits after the skipped application data packet until the end of the application data table will be in the wrong place.

Figure 3A:
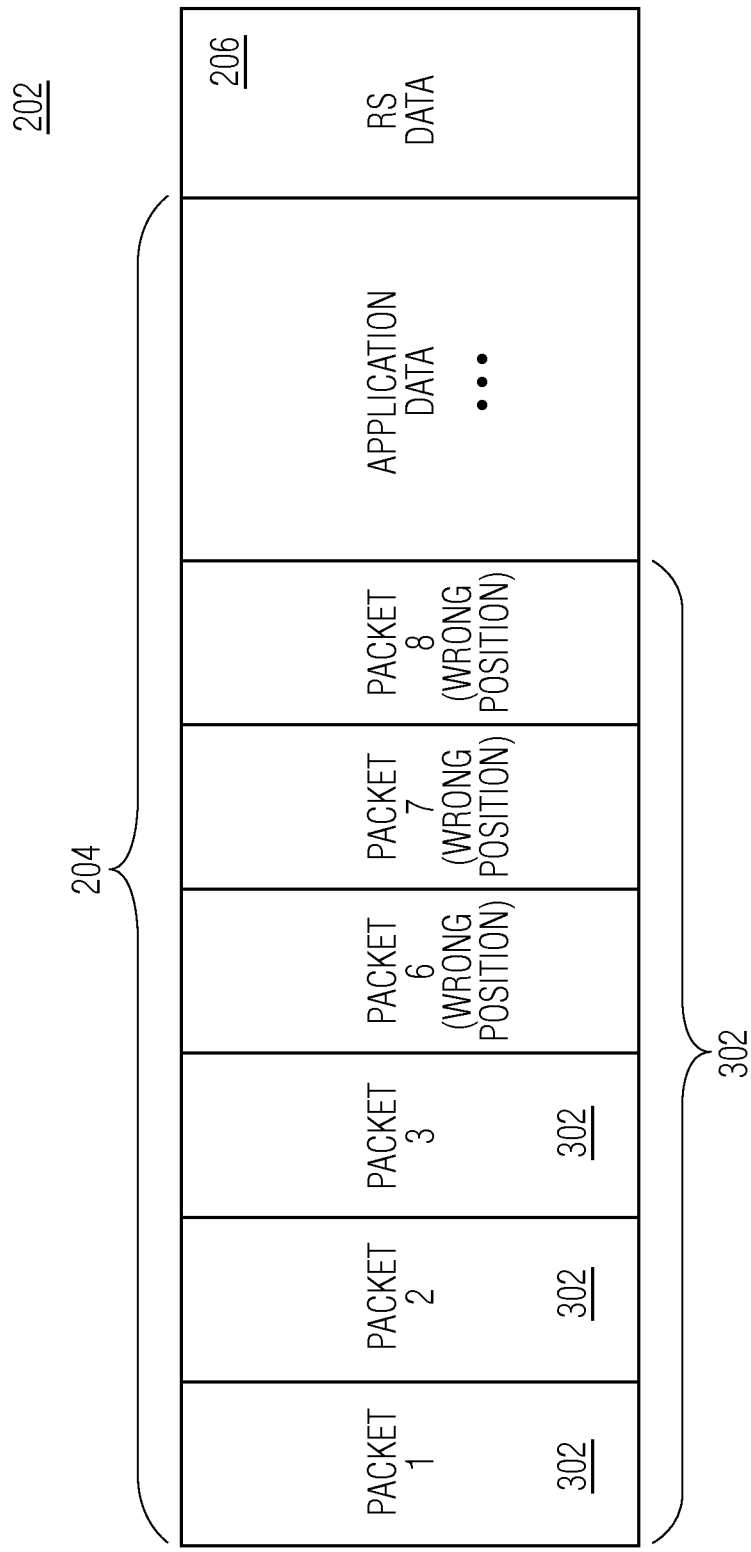
FIG. 3A is a block diagram of a packet stream.

FIG. 3A is a block diagram of a corrupt FEC table 202. In practice, multiple application data packets 302 can correspond to each RS data packet in the RS data table 206, but for purposes of simplification, FIGS. 3A and 3B assume that each RS data packet corresponds to just one application data packet. In the table, packets 4 and 5 have been lost. Because packets 4 and 5 have been lost, the FEC table is consecutively filled with application data from packets numbered 1, 2, 3, 6, 7, and 8. Thus, when the application data and RS Data are filled into the FEC table 202, application data from packets 1-3 will correspond to RS data for packets 1-3, but application data from packets 6-8 will correspond to RS data for packets 4-6 respectively (e.g., application data for packet 6 will fill the same row as RS data for packet 4). This mismatch will corrupt the FEC table in most cases except for in the rare case when the RS data for packets 4-6 matches the RS data from packets 6-8.

Figure 3B:
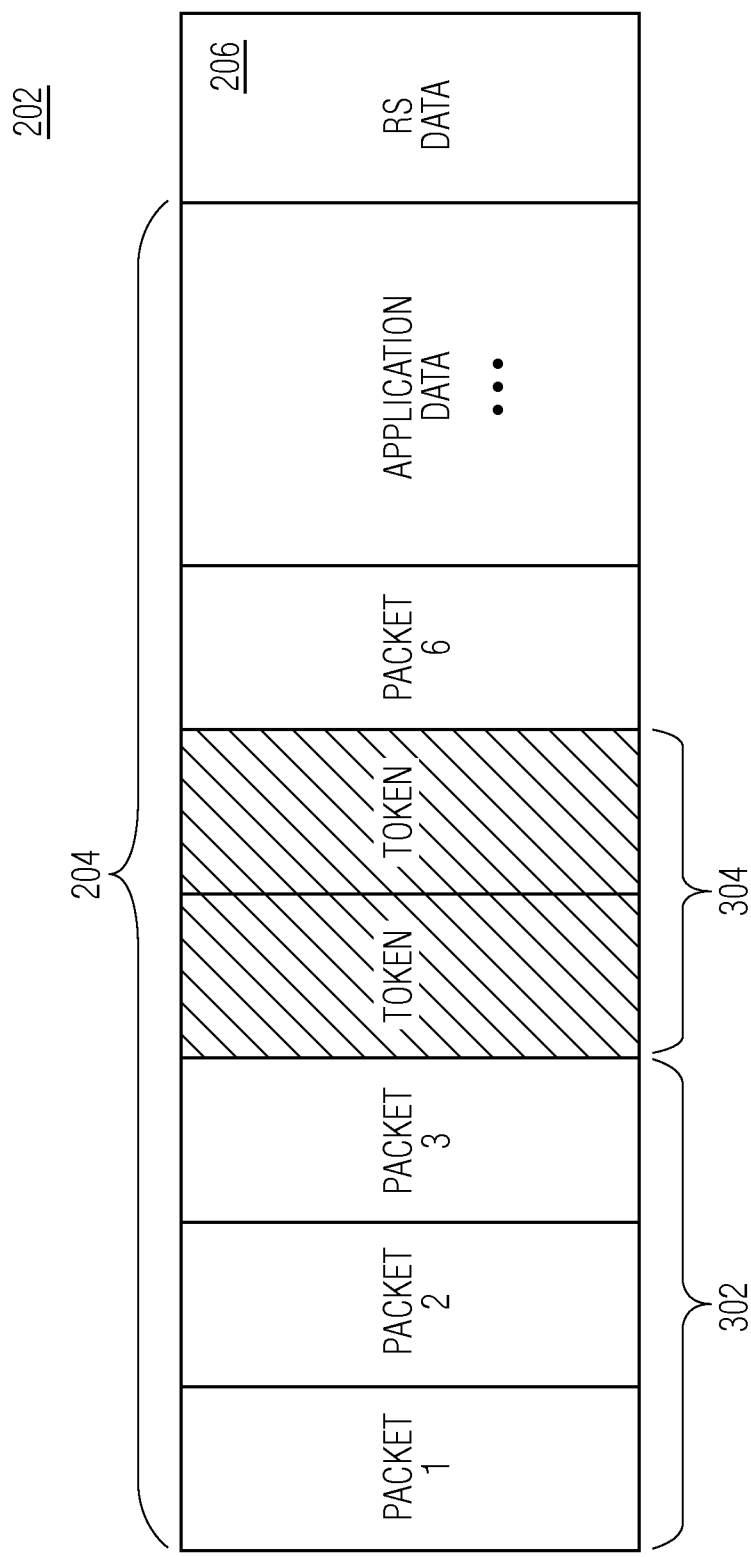
FIG. 3B is a block diagram of a packet stream in accordance with an embodiment of the invention.

In order to prevent corruption of the FEC table 202 due to a lost packet, token packets 304 can be used to avoid placement of subsequent packets in the wrong position within the FEC table. For example, FIG. 3B is a block diagram of a FEC table that has been preserved using token packets to avoid placement of subsequent packets in the wrong position within the FEC table. In the FEC table, application data packets 4 and 5 have been lost but replaced with token packets. Because token packets are used, the FEC table is now consecutively filled with application data from packets numbered 1, 2, and 3, then two rows of data from tokens (i.e., zeros generated in response to tokens), and then application data from the packet numbered 6. As a result, the application data from packet 6 will now fill the same row as RS data corresponding to packet 6 and, thus, no false errors occur and the proper arrangement of data within the FEC table is preserved.

Figure 4:
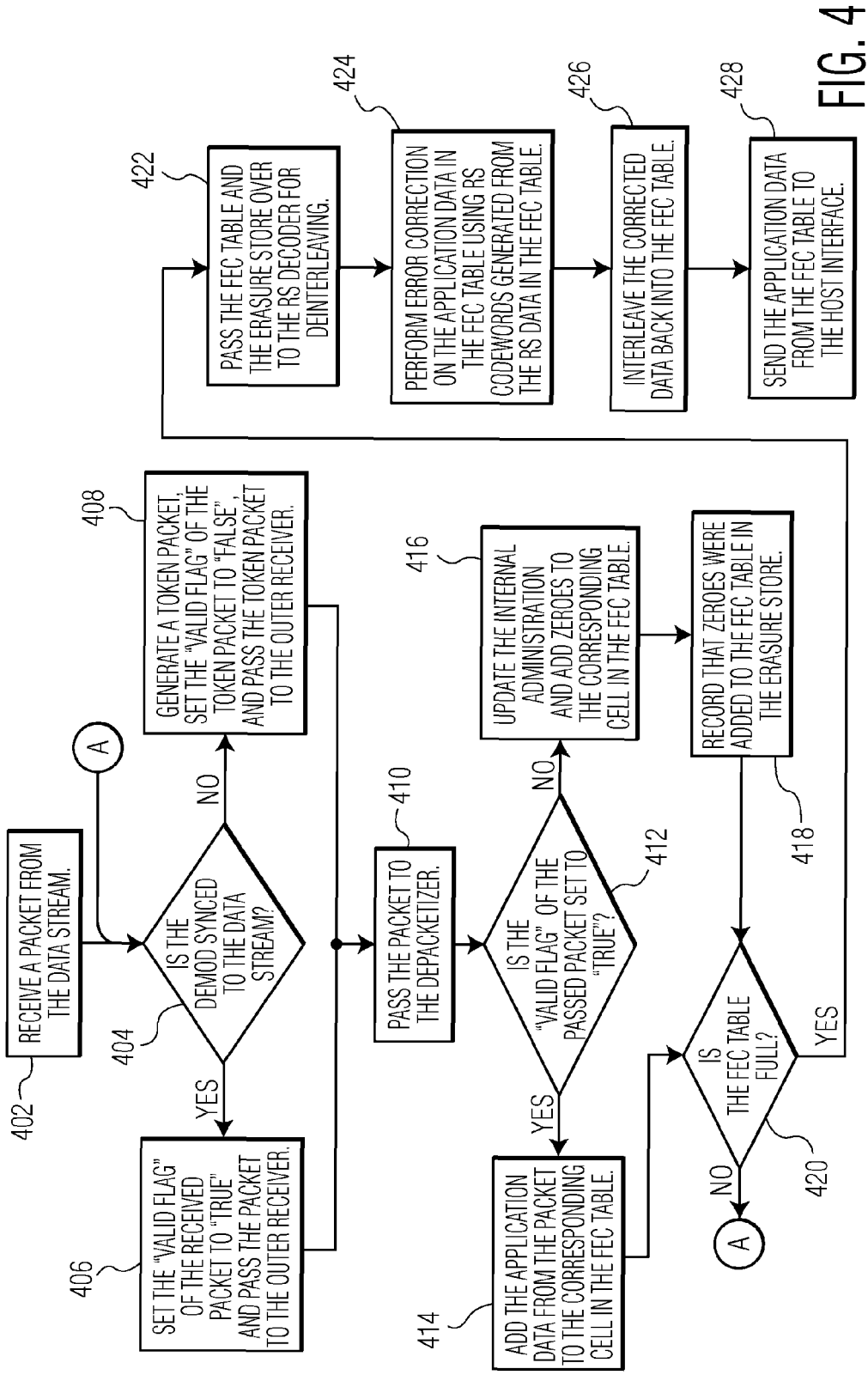
FIG. 4 is a process flow diagram of a method for performing FEC on protected data packets.

An example of a process of generating token packets to preserve the FEC table is depicted by a flow chart in FIG. 4. At block 402, the demodulator receives a packet from a data stream. At decision point 404, a determination is made whether the demodulator is synched to the data stream and, at block 406, when a packet is received by the demodulator when the demodulator is synced to the data stream, the demodulator adds metadata (e.g., time, mode, and validity information) to the packet and sets a "valid flag" to "true." However, at block 408, if a packet is received and the demodulator is not synced to the data stream (e.g., the demodulator has not yet synchronized itself to the data stream or the demodulator determines that it is out of sync with the data stream), then the demodulator starts generating token packets. Each token packet contains the same metadata as a normal packet (e.g., time, mode, and validity information) but, unlike a normal packet, the "valid flag" is set to "false" and no application data is included in the packet.

At block 410, after the "valid flag" has been set, the packet is passed to the outer receiver. If the "valid flag" is set to "true," then the received packet (i.e., the packet containing application data) is passed to the outer receiver and, if the "valid flag" is set to "false," then the token packet (i.e., a generated packet without any application data) is passed to the outer receiver. The outer receiver then processes the data in the packet by time de-interleaving, depuncturing, viterbi decoding, and descrambling the data from the packet. At decision point 412, a determination is made by the depacketizer whether the "valid flag" is set to "true" or "false." At block 414, if the "valid flag" is set to "true," then the application data from the received packet is added into the corresponding cell of the FEC table. Alternatively, at block 416, if the "valid flag" is set to "false," then the depacketizer updates its internal administration and adds zeroes (erased data) to the corresponding cell in the FEC table. In an embodiment, the internal administration tracks how much data has been copied into a buffer as well as the synchronization state of the packet stream, where the synchronization state is typically determined by checking the RS data packets. At block 418, the depacketizer then records that zeroes were added in an erasure store of FIG. 1. In another embodiment, the depacketizer does not record that zeroes were added in the erasure store.

After adding data to the FEC table, at decision point 420, the depacketizer determines if the FEC table is full. If the table is not full, the process repeats. If the table is full, then, at block 422, the erasure store is converted into a record of the cells with erased data (erasure record) and the FEC table and erasure record are passed to the RS decoder for de-interleaving. At block 424, once the FEC table is de-interleaved, the RS decoder performs error correction on the application data using RS codewords generated from RS data in the same row as the application data in the FEC table. At block 426, once the error correction has been performed, the RS decoder interleaves the corrected application data back into the FEC table and passes the FEC table back to the depacketizer. At block 428, the depacketizer then sends the corrected application data to the host interface.

Although the operations of the method(s) herein are shown and described using Digital Audio Broadcasting, the operations could similarly be implemented for DAB+ and Terrestrial Digital Multimedia Broadcasting (TDMB) as well. Additionally, the order of the operations of each method shown and described herein may be altered so that certain operations may be performed in an inverse order or so that certain operations may be performed, at least in part, concurrently with other operations. In another embodiment, instructions or sub-operations of distinct operations may be implemented in an intermittent and/or alternating manner. Additionally, while the operations herein are shown and described It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for performing forward error correction (FEC) on protected data packets, the method comprising:
    creating a FEC table having columns for application data and columns for error-correction data (EC data);
    receiving a number of protected application data packets, the protected application data packets comprising application data, and EC data corresponding to the application data;
    placing data in the application data columns of the FEC table until the application data columns are full,
    wherein placing data in the application data columns comprises:
        determining if an application data packet is received; and
        if the application data packet is not received, placing generated zeroes in the application data column; and
        if the application data packet is received, placing the application data from the application data packet in the application data column; and
    placing EC data from the application data packet in the EC columns of the FEC table until the EC columns are full;
    feeding at least one row of the FEC table to a decoder; and
    correcting bits in the application data columns accordingly;
    wherein non-receipt of the application data packet is determined by a demodulator module based on the synchronization state of the demodulator module wherein:
        if the demodulator module is synchronized with a signal containing the application data packet, then determining that the application data packet is received; and
        if the demodulator module is not synchronized with the signal containing the application data packet, then determining that the application data packet is not received.

2. The method of claim 1,
    wherein the data are placed consecutively in the application data columns of the FEC table.

3. The method of claim 1,
wherein the protected application data packets are Reed-Solomon protected data packets.

4. The method of claim 1,
wherein the FEC table has fixed dimensions of 12 rows and 204 columns resulting in a size of 2256 application data bytes and 192 EC bytes.

5. The method of claim 1,
wherein if the application data packet is not received, the generated zeros are placed in a row that the application data of the application data packet would have been placed.

6. The method of claim 1,
wherein the protected application data packets are at least one of Digital Audio Broadcasting (DAB) application data packets, DAB+ application data packets, and Terrestrial Digital Multimedia Broadcasting (TDMB) application data packets.

7. The method of claim 1,
wherein the FEC table is created within a depacketizer.

8. A radio signal receiver configured to prevent corruption of a forward error correction table (FEC table) due to a lost packet, the receiver comprising:
a demodulator module configured to insert a token into a packet stream when loss of a packet is detected; and
a depacketizer configured to place filler data into a FEC table at a location which the application data of the lost packet would have occupied;
wherein detecting the loss of a packet is facilitated by the demodulator module based on the synchronization state of the demodulator module wherein:
if the demodulator module is synchronized with a signal containing the packet, then a packet is detected to be received; and
if the demodulator module is not synchronized with the signal containing the packet, then a packet is detected to be lost.

9. The radio signal receiver of claim 8,
wherein the packet stream is configured for Reed-Solomon protected data packets.

10. The radio signal receiver of claim 8,
wherein the FEC table has fixed dimensions of 12 rows and 204 columns resulting in a size of 2256 application data bytes and 192 EC bytes.

11. The radio signal receiver of claim 8,
wherein the lost packets are at least one of Digital Audio Broadcasting (DAB) application data packets, DAB+ application data packets, and Terrestrial Digital Multimedia Broadcasting (TDMB) application data packets.

12. The radio signal receiver of claim 8,
wherein the FEC table is created within the depacketizer.

13. A method for preventing corruption of a forward error correction table (FEC table) due to a lost packet, the method comprising:
inserting a token into a packet stream when loss of a packet is detected; and
placing filler data into a FEC table at a location which application data of the packet would have occupied;
wherein detecting the loss of a packet is facilitated by a demodulator module based on the synchronization state of the demodulator module wherein:
if the demodulator module is synchronized with a signal containing the packet, then the packet is detected to be received; and
if the demodulator module is not synchronized with the signal containing the packet, then the packet is detected to be lost.

14. The method of claim 13,
wherein the FEC table has fixed dimensions of 12 rows and 204 columns resulting in a size of 2256 application data bytes and 192 EC bytes.

15. The method of claim 13,
wherein the lost packets are at least one of Digital Audio Broadcasting (DAB) application data packets, DAB+ application data packets, and Terrestrial Digital Multimedia Broadcasting (TDMB) application data packets.

16. The method of claim 13, wherein the FEC table is created within a depacketizer.

* * * * *